(12) United States Patent
Kojima et al.

(10) Patent No.: US 7,968,892 B2
(45) Date of Patent: Jun. 28, 2011

(54) SILICON CARBIDE SEMICONDUCTOR DEVICE

(75) Inventors: Jun Kojima, Iwakura (JP); Takeshi Endo, Obu (JP); Eiichi Okuno, Mizuho (JP); Yoshihito Mitsuoka, Toyota (JP); Yoshiyuki Hisada, Okazaki (JP); Hideo Matsuki, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/882,137

(22) Filed: Jul. 31, 2007

(65) Prior Publication Data

US 2007/0281173 A1 Dec. 6, 2007

Related U.S. Application Data

(62) Division of application No. 11/108,906, filed on Apr. 19, 2005, now Pat. No. 7,365,363.

(30) Foreign Application Priority Data

Apr. 19, 2004 (JP) ................ 2004-122796
Jun. 23, 2004 (JP) ................ 2004-185521

(51) Int. Cl.
*H01L 31/0256* (2006.01)
(52) U.S. Cl. .............. 257/76; 257/77; 257/E29.118
(58) Field of Classification Search ........... 257/77, 257/76, E29.118
See application file for complete search history.

(56) References Cited

U.S. PATENT DOCUMENTS

| 5,243,204 | A | | 9/1993 | Suzuki et al. | |
|---|---|---|---|---|---|
| 5,313,078 | A | * | 5/1994 | Fujii et al. | ............ 257/77 |
| 5,976,936 | A | | 11/1999 | Miyajima et al. | |
| 6,020,600 | A | | 2/2000 | Miyajima et al. | |
| 6,097,039 | A | | 8/2000 | Peters et al. | |
| 6,165,812 | A | | 12/2000 | Ishibashi et al. | |
| 6,573,534 | B1 | | 6/2003 | Kumar et al. | |
| 6,890,600 | B2 | | 5/2005 | Nakamura et al. | |
| 7,081,420 | B2 | | 7/2006 | Kamata et al. | |
| 2004/0159841 | A1 | * | 8/2004 | Hisada et al. | ............ 257/77 |
| 2005/0160965 | A1 | | 7/2005 | Ohtani et al. | |
| 2008/0020212 | A1 | | 1/2008 | Ohtani et al. | |
| 2010/0083897 | A1 | | 4/2010 | Ohtani et al. | |
| 2010/0089311 | A1 | | 4/2010 | Ohtani et al. | |

FOREIGN PATENT DOCUMENTS

| JP | A-8-245299 | 9/1996 |
|---|---|---|
| JP | A-2000-106428 | 4/2000 |
| JP | A-2003-158267 | 5/2003 |

OTHER PUBLICATIONS

Office Action dated Sep. 26, 2007 in U.S. Appl. No. 11/108,906.

(Continued)

*Primary Examiner* — Thien F Tran
(74) *Attorney, Agent, or Firm* — Posz Law Group, PLC

(57) ABSTRACT

A silicon carbide semiconductor device includes: a semiconductor substrate having a principal surface and a backside surface; a drift layer disposed on the principal surface; a base region disposed on the drift layer; a source region disposed on the base region; a surface channel layer disposed on both of the drift layer and the base region for connecting between the source region and the drift layer; a gate insulation film disposed on the surface channel layer and including a high dielectric constant film; a gate electrode disposed on the gate insulation film; a source electrode disposed on the source region; and a backside electrode disposed on the backside surface.

3 Claims, 17 Drawing Sheets

OTHER PUBLICATIONS

Examination Report from Swedish Patent Office issued on Mar. 10, 2006 for the corresponding Swedish patent application No. 0600122-6 (and English translation thereof).

Office Action mailed on Apr. 27, 2010 from Japanese Patent Office in corresponding Japanese patent application No. 2004-122796 (and English translation).

Notice of Reason for Refusal mailed on May 18, 2010 issued from the Japanese Patent Office in the corresponding Japanese patent application No. 2004-185521 (with English translation).

Office Action dated on Aug. 10, 2010 issued from the Japanese Patent Office in corresponding Japanese patent application No. 2004-185521 (with English translation).

* cited by examiner

POLISHING

SILICON CARBIDE SEMICONDUCTOR DEVICE

CROSS REFERENCE TO RELATED APPLICATIONS

This application is a division of application Ser. No. 11/108,906 filed on Apr. 19, 2005, now U.S. Pat. No. 7,365,363 which is based on Japanese Patent Applications No. 2004-122796 filed on Apr. 19, 2004, and No. 2004-185521 filed on Jun. 23, 2004, the disclosures of which are incorporated herein by reference.

FIELD OF THE INVENTION

The present invention relates to a silicon carbide semiconductor device and a method for manufacturing a silicon carbide semiconductor device.

BACKGROUND OF THE INVENTION

Conventionally, Japanese Patent Application Publication No. H11-266017 (which corresponds to U.S. Pat. No. 6,573,534) discloses a power MOSFET as a silicon carbide semiconductor device operated in an accumulation mode. In this power MOSFET, an $N^-$ conductive type layer is disposed on a surface of a $N^-$ conductive type base region and disposed under a gate oxide film made of $SiO_2$ so that the $N^-$ conductive type layer connects between a $N^+$ conductive type source region and a $N^+$ conductive type epitaxial layer (i.e., a $N^+$ conductive type epi-layer).

The silicon carbide semiconductor device having the above construction becomes an off-state when the $N^-$ conductive type layer becomes a depletion layer before a voltage is applied to the gate electrode. When the voltage is applied to the gate electrode, a channel region is formed at an interface between the $N^-$ conductive type layer and the gate insulation film. The channel region extends from the $N^+$ conductive type source region 4a, 4b to two directions of the $N^-$ conductive type drift regions. Thus, the device switches from the off-state to an on-state so that the device flows current therethrough.

Thus, the above power MOSFET is operated in an accumulation mode so that the channel is induced without reversing the conductive type of the channel formation layer. Thus, the above MOSFET is capable of enlarging channel mobility so that an on-state resistance is reduced, compared with a MOSFET operated in a reverse mode for reversing the conductive type.

In the above power MOSFET having the above construction, the gate insulation film is made of an oxide film (i.e., $SiO_2$). However, an interface state is formed between the gate insulation film and the $N^-$ conductive type layer for forming the channel in a case where the gate insulation film is composed of the oxide film. Further, the interface state is formed near a conduction band of energy space, in which an electron current flows. Therefore, the charged interface state affects current flow so that the channel mobility is reduced. Further, the on-state resistance of the power MOSFET is increased. Thus, it is confirmed that this problem is occurred.

Further, in general, an eight-degree offset substrate is used in a process for manufacturing a silicon carbide semiconductor substrate. A film is epitaxially grown on the eight-degree offset substrate by a step growth method.

However, the eight-degree offset surface of the SiC substrate is not a stable surface. Therefore, a defect caused by polishing is easily generated when a wafer is processed. Thus, it is difficult to form homogeneous surface state in a wafer surface. Therefore, for example, a device fault is occurred at a portion of a substrate having bad surface state such as a defect caused by polishing in a MOS transistor. The MOS transistor includes a source region, a drain region, a gate oxide film, and a gate electrode formed on a surface portion of the substrate. In detail, when the defect caused by polishing is disposed on the surface of the substrate, current leakage is easily occurred at the gate oxide film.

Further, when a device is formed in the SiC substrate after epitaxial growth, for example, a crystal defect due to the defect caused by polishing on the surface of the substrate may generate in the epitaxial layer of the device (i.e., diode), so that current leakage (i.e., a PN junction leakage) is easily occurred. The device has the epitaxial layer on the substrate, in which a P conductive type region is formed, and has an anode electrode and a cathode electrode.

SUMMARY OF THE INVENTION

In view of the above-described problem, it is an object of the present invention to provide a silicon carbide semiconductor device and a method for manufacturing a silicon carbide semiconductor device, the device having small on-state resistance.

It is another object of the present invention to provide a silicon carbide semiconductor substrate and a method for manufacturing the silicon carbide semiconductor substrate, the substrate having excellent surface state and excellent regularity with suppressing a defect.

To accomplish the above object, a silicon carbide semiconductor device has a gate insulation film including a high dielectric constant film. The device has a stack type channel layer contacting the gate insulation film.

Thus, the high dielectric constant film is formed on the surface of the channel layer, so that the interface state is not concentrated with high density near the conduction band. Accordingly, the problem of reducing the channel mobility caused by the interface state affecting to the current flow can be solved. Thus, the channel mobility is improved. Thus, the device has small on-state resistance.

Preferably, a stack construction of the high dielectric constant film and the oxide film formed on the surface of the high dielectric constant film provides the gate insulation film.

Thus, the interface state is not concentrated with high density near the conduction band at a portion of the gate insulation film contacting the channel layer. Further, the oxide film is formed on the high dielectric constant film so that a difference $\Delta Ec$ measured from an edge of an energy level Ec of the silicon carbide can become larger. Thus, an energy threshold of generation of a gate leakage current is increased, so that the gate leakage current is prevented from generating.

Preferably, the semiconductor substrate is a single crystal silicon carbide substrate having the principal surface tilted by 10 degrees to 20 degrees from a (0001)-Si surface. Here, semiconductor substrates having various off-set angles are prepared, and a correlation between the off-set angle and a density of defects caused by polishing is studied. It is confirmed that the polishing defects are dominantly reduced when the off-set angle is equal to or larger than 10 degrees. Further, it is confirmed that the roughness on the surface is reduced so that the semiconductor substrate having small amount of crystal defects is formed.

Accordingly, when the surface tilted by 10 degrees to 20 degrees from the (0001)-Si surface is used, the interface state is reduced, compared with other surfaces. The (0001)-Si surface can provide small amount of crystal defects. Thus, the influence of the interface state to the current flow is reduced. Thus, the channel mobility of the power MOSFET is further improved.

Preferably, the semiconductor substrate is a single crystal silicon carbide substrate with the principal surface having at least two surfaces, one of which is tilted by 10 degrees to 20 degrees from a (0001)-Si surface, and the other one of which is the (0001)-Si surface. The single crystal silicon carbide substrate with the one surface tilted by 10 degrees to 20 degrees from the (0001)-Si surface and the (0001)-Si surface as the principal surface provides to reduce the interface state, compared with the single crystal silicon carbide substrate having other surface as the principal surface. Thus, the influence of the interface state to the current flow is much reduced. Thus, the channel mobility of the power MOSFET is further improved.

Preferably, the one surface tilted by 10 degrees to 20 degrees from the (0001)-Si surface has an area larger than an area of the (0001)-Si surface. In this case, the above influence is effectively much reduced. Further, as described in claim 6, the one surface tilted by 10 degrees to 20 degrees from the (0001)-Si surface is tilted toward a <11-20>-direction. In this case, the above influence is effectively much reduced, so that it is preferable.

More preferably, the one surface tilted by 10 degrees to 20 degrees from the (0001)-Si surface is a (11-2N)-surface, wherein N satisfies a relationship of $17 \leq N \leq 38$. In this case, the above influence is effectively much reduced, so that it is preferable.

Further, in a silicon carbide semiconductor substrate, a principal surface of the substrate is a surface tilted by 10 degrees or more from a (0001)-Si surface. Therefore, the surface has excellent surface state and excellent regularity with suppressing a defect, compared with an eight-degree offset substrate, which is a silicon carbide semiconductor substrate having a principal surface tilted by 8 degrees from the (0001)-Si surface. Thus, the surface has homogeneous and stable surface state in an area of a substrate surface so that the surface provides a semiconductor-device-to-be-formed surface.

Here, preferably, an angle equal to or larger than 10 degrees of the silicon carbide semiconductor substrate is in a range between 10 degrees and 20 degrees. More preferably, the angle equal to or larger than 10 degrees is in a range between 13 degrees and 20 degrees.

Further, an epitaxial layer is formed on the principal surface of the silicon carbide semiconductor substrate. In this case, the epitaxial layer has excellent surface state, and further, generation of crystal defect can be prevented.

Further, in a silicon carbide semiconductor substrate, a principal surface of the substrate is composed of two surface, one of which is a (0001)-Si surface, and the other one of which is a surface tilted by 10 degrees or more from the (0001)-Si surface. Therefore, the surface has excellent surface state and excellent regularity with suppressing a defect, compared with an eight-degree offset substrate, which is a silicon carbide semiconductor substrate having a principal surface tilted by 8 degrees from the (0001)-Si surface. Thus, the surface has homogeneous and stable surface state in an area of a substrate surface so that the surface provides a semiconductor-device-to-be-formed surface.

It is preferred that, regarding to an area of the surface tilted by 10 degrees or more from the (0001)-Si surface and an area of the (0001)-Si surface, the area of the surface tilted by 10 degrees or more from the (0001)-Si surface is larger than the area of the (0001)-Si surface in the silicon carbide semiconductor substrate.

It is preferred that the surface tilted by 10 degrees or more from the (0001)-Si surface is a (11-2N)-surface, wherein the N satisfies a relationship of $17 \leq N \leq 38$ in the silicon carbide semiconductor substrate.

Further, a method for manufacturing a silicon carbide semiconductor substrate includes the steps of: a first step of preparing a silicon carbide semiconductor substrate having a principal surface tilted by 10 degrees or more from a (0001)-Si surface by a scribing method; a second step of mirror-polishing the principal surface of the silicon carbide semiconductor substrate; and a third step of forming an epitaxial layer on the principal surface in such a manner that the epitaxial layer is epitaxially grown on the principal surface of the silicon carbide semiconductor substrate.

Furthermore, a method for manufacturing a silicon carbide semiconductor substrate includes the steps of: a first step of preparing a silicon carbide semiconductor substrate having a principal surface composed of at least two surfaces, one of which is a surface tilted by 10 degrees or more from a (0001)-Si surface, and the other one of which is the (0001)-Si surface, wherein two surfaces are formed in such a manner that the mirror-polished silicon carbide semiconductor substrate is performed with heat treatment in vacuum and atmosphere including silicon so that two surfaces are formed on the principal surface of the silicon carbide semiconductor substrate by a step bunching method; and a second step of forming an epitaxial layer on the principal surface in such a manner that the epitaxial layer is epitaxially grown on the principal surface of the silicon carbide semiconductor substrate.

Further, a method for manufacturing a silicon carbide semiconductor substrate includes the steps of: a first step of preparing a silicon carbide semiconductor substrate having a principal surface composed of at least two surfaces, one of which is a surface tilted by 10 degrees or more from a (0001)-Si surface, and the other one of which is the (0001)-Si surface, wherein two surfaces are formed in such a manner that the mirror-polished silicon carbide semiconductor substrate is performed with heat treatment in vacuum, hydrogen gas atmosphere and hydrogen chloride gas atmosphere so that two surfaces are formed on the principal surface of the silicon carbide semiconductor substrate by a step bunching method; and a second step of forming an epitaxial layer on the principal surface in such a manner that the epitaxial layer is epitaxially grown on the principal surface of the silicon carbide semiconductor substrate.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
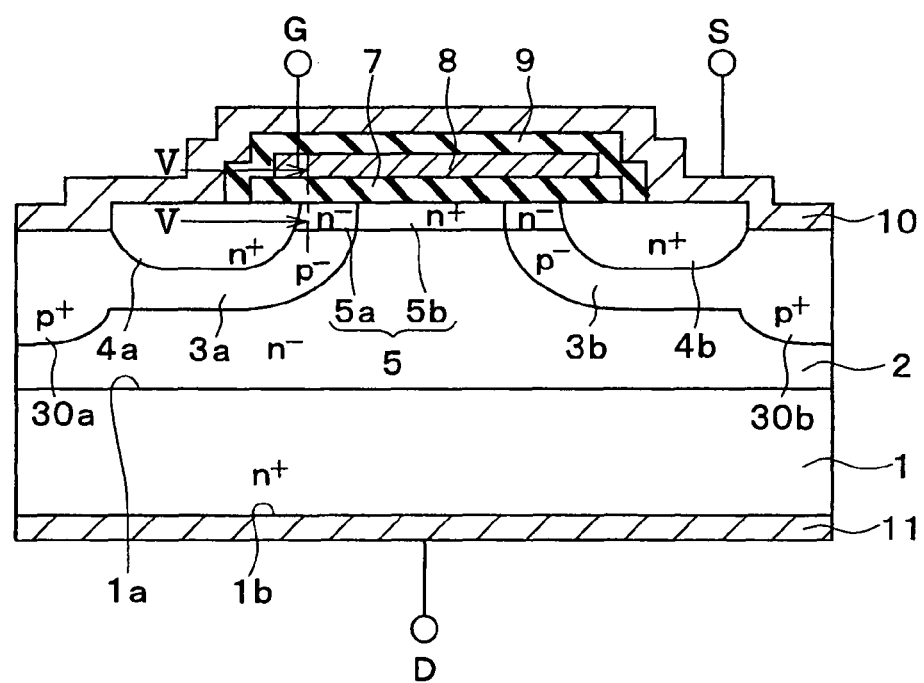
FIG. 1 is a cross sectional view showing a power MOSFET according to a first embodiment of the present invention.

FIG. 1 is a cross sectional view showing a normally off type N channel planer type MOSFET (i.e., a vertical type power MOSFET) according to a first embodiment of the present invention. The device is suitably used for a rectifier of an alternator or an inverter of an automotive vehicle. The construction of the planer type MOSFET is described with reference to FIG. 1 as follows. Specifically, the device provides an insulation gate type field effect transistor for large amount of power.

A N⁺ conductive type semiconductor substrate 1 made of silicon carbide has an upper surface as a principal surface 1a, and a lower surface as a bottom surface 1b, which is opposite to the principal surface 1a. A N⁻ conductive type epitaxial layer (i.e., a N⁻ conductive type epitaxial layer) 2 is stacked on the principal surface 1a of the N⁺ conductive type semiconductor substrate 1. The N⁻ conductive type epitaxial layer 2 is made of silicon carbide and has a dopant concentration lower than that of the substrate 1. Here, the upper surface of the N⁺ conductive type semiconductor substrate 1 and the upper surface of the N⁻ conductive type epitaxial layer 2 are a (0001)-Si surface. However, the upper surface of the N⁺ conductive type semiconductor substrate 1 and the upper surface of the N⁻ conductive type epitaxial layer 2 can be a (11-20)-A surface. When the (0001)-Si surface is used, the low surface density of state is obtained. When the (11-20)-A surface is used, the low surface density of state is obtained, and further, the crystal having no screw dislocation is obtained.

A P⁻ conductive type base region 3a and a P⁻ conductive type base region 3b are separately formed on a predetermined region of the surface portion of the N⁻ conductive type epitaxial layer 2. The P⁻ conductive type base regions 3a, 3b have a predetermined depth. Deep base regions 30a, 30b are formed in the base regions 3a, 3b. Each deep base region 30a, 30b has a part partially thickened. The deep base region 30a, 30b is formed on a part, which is not overlapped to the N⁺ conductive type source region 4a, 4b. The thick portion of the P⁻ conductive type silicon carbide base region 3a, 3b, the thick portion in which the deep base region 30a, 30b is formed, has an impurity concentration higher than that of a thin portion, in which the deep base region 30a, 30b is not formed.

The thickness of the N⁻ conductive type-epitaxial layer 2 disposed under the deep base region 30a, 30b becomes thinner according to the deep base region 30a, 30b (i.e., the distance between the N⁺ conductive type semiconductor substrate 1 and the deep base region 30a, 30b becomes shorter). Therefore, the electric field intensity is increased. Thus, avalanche breakdown is easily occurred.

The N⁺ conductive type source regions 4a, 4b are formed on predetermined regions of the surface portion of the P⁻ conductive type base regions 3a, 3b, respectively. The N⁺ conductive type source regions 4a, 4b are shallower than the base regions 3a, 3b. Further, a N conductive type surface channel layer 5 made of silicon carbide extends on the surfaces of the N⁻ conductive type epitaxial layer 2 and the P⁻ conductive type base region 3a, 3b and disposed between the N⁺ conductive type source region 4a and the N⁺ conductive type source region 4b. Thus, the N conductive type channel layer 5 is disposed on the surfaces of the P⁻ conductive type base regions 3a, 3b to connect between the source regions 4a, 4b and the N⁻ conductive type epitaxial layer 2.

This N conductive type surface channel layer 5 includes a N⁻ conductive type layer 5a having a low impurity concentration and a N⁺ conductive type layer 5b having a high impurity concentration. The N⁻ conductive type layer 5a is disposed on the surface portion of the P⁻ conductive type base regions 3a, 3b. The N⁺ conductive type layer 5b is disposed on the surface portion of the N⁻ conductive type epitaxial layer 2. The N conductive type channel layer 5 works as a channel-to-be-formed portion on a device surface when the device is operated. The surface portion of the P⁻ conductive type base layers 3a, 3b in the N⁻ conductive type channel layer 5 is composed of the N⁻ conductive type layer 5a having the low impurity concentration, so that the impurity concentration of the channel-to-be-formed portion is controlled substantially.

Further, the surface portion of the N⁻ conductive type epitaxial layer 2 is composed of the N⁺ conductive type layer 5b having the high impurity concentration, so that the inner resistance of the N conductive type channel layer 5 is reduced. Thus, the on-state resistance is reduced.

A gate insulation film 7 is formed on the upper surface of the surface channel layer 5 and the upper surfaces of the N⁺ conductive type source regions 4a, 4b. Further, a poly-crystal silicon gate electrode 8 is formed on the gate insulation film 7. The poly-crystal silicon gate electrode 8 is covered with an insulation film 9. The insulation film 9 is formed of a LTO (i.e., Low Temperature Oxide) film. A source electrode 10 is formed on the insulation film 9 so that the source electrode 10 contacts the N⁺ conductive type source regions 4a, 4b and the P⁻ conductive type base regions 3a, 3b. A drain electrode 11 as a backside electrode is formed on the backside surface 1b of the N⁺ conductive type semiconductor substrate 1.

A J-FET portion is provided by a portion of the N⁻ conductive type epitaxial layer 2 sandwiched by the P⁻ conductive type base regions 3a, 3b.

Next, a method for manufacturing the vertical type power MOSFET shown in FIG. 1 is explained with reference to FIG. 2A to FIG. 4C.

Figure 2A:
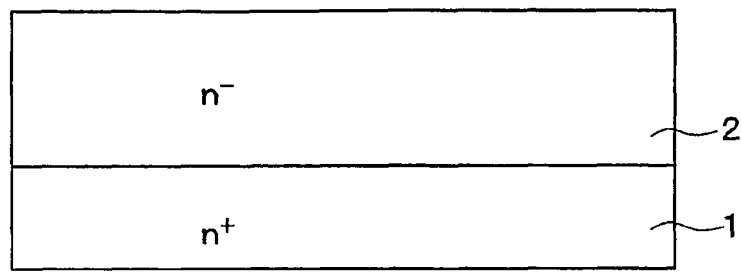
FIGS. 2A to 2C are cross sectional views explaining a method for manufacturing the power MOSFET shown in FIG. 1.

(Process Shown in FIG. 2A)

Firstly, a N conductive type SiC substrate having 4H, 6H or 3C crystal structure as the N⁺ conductive type semiconductor substrate 1 is prepared. For example, the N⁺ conductive type semiconductor substrate 1 has a thickness of 400 μm and a principal surface 1a of a (0001)-Si surface or a (11-20)-A surface. The N⁻ conductive type epitaxial layer 2 is deposited on the principal surface 1a of the substrate 1 by an epitaxial growth method. The N⁻ conductive type layer 2 has a thickness of 5 μm. Thus, the N⁻ conductive type epitaxial layer 2 has the same crystallinity as the substrate 1 as a base so that the N⁻ conductive type epitaxial layer 2 provides a N conductive type 4H, 6H or 3C SiC layer.

Figure 2B:
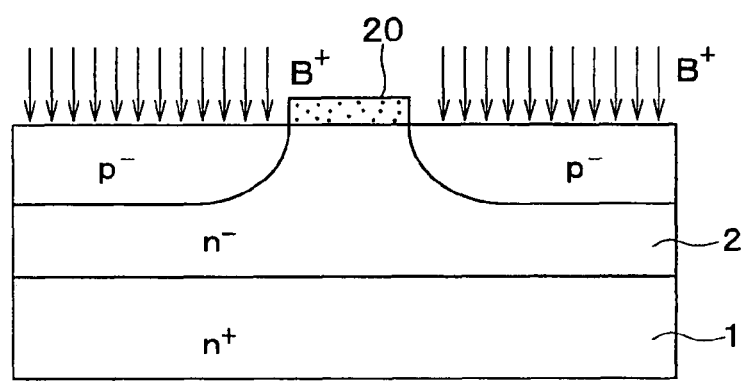

(Process Shown in FIG. 2B)

The LTO film 20 is disposed on a predetermined area of the N⁻ conductive type epitaxial layer 2. The LTO film 20 works as a mask so that B⁺ ions (or an Al ions) are implanted. Thus, the P⁻ conductive type base regions 3a, 3b are formed. At this time, the conditions of the ion implantation are such than the temperature is 700° C., and the dose amount of the ions is $1 \times 10^{16}$ cm⁻².

Figure 2C:
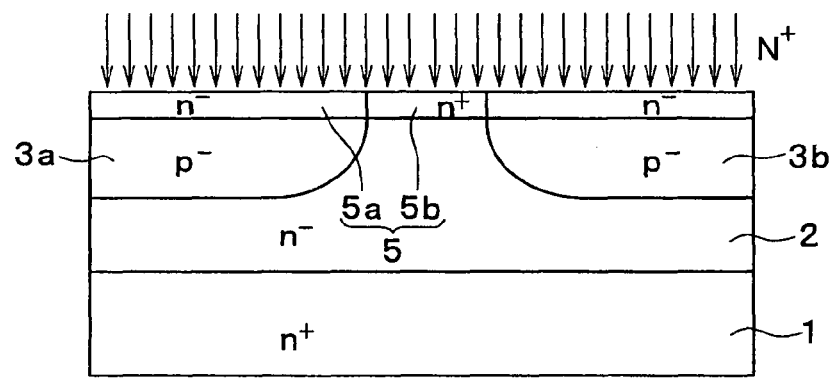

(Process Shown in FIG. 2C)

After the LTO film 20 is removed, the N⁺ ions are implanted from the upper side of the substrate 1 so that the surface channel layer 5 is formed on the surface portion of the N⁻ conductive type epitaxial layer 2 and the surface portion (i.e., surface layer) of the P⁻ conductive type base regions 3a, 3b. At this time, the conditions of the ion implantation are such than the temperature is 700° C., and the dose amount of the ions is $1 \times 10^{16}$ cm⁻². Thus, the surface channel layer 5 at the surface portion of the P⁻ conductive type base regions 3a, 3b is compensated so that the N conductive type impurity concentration becomes a thin N⁻ conductive type layer 5a. Further, the N conductive type impurity concentration at the surface portion of the N⁻ conductive type epitaxial layer 2 becomes the thick N⁺ conductive type layer 5b.

To form the normally off type vertical power MOSFET, the above conditions of the ion implantation are determined in such a manner that the total amount of extension amount of the depletion layer-extending from the P⁻ conductive type base regions 3a, 3b and extension amount of the depletion layer extending from the gate insulation film 7 is equal to or larger than a thickness of the surface channel layer 5.

The above normally off type vertical power MOSFET has reliability compared with a normally on type MOSFET. This is because the normally off type MOSFET can stop to flow current therethrough even when the voltage is not applied to the gate electrode because of failure.

Figure 3A:
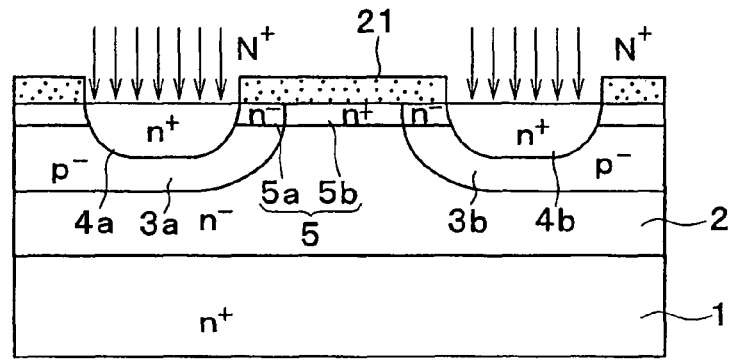
FIG. 3A to 3C are cross sectional views explaining the method for manufacturing the power MOSFET shown in FIG. 1; for manufacturing the power MOSFET shown in FIG. 1.

(Process Shown in FIG. 3A)

ALTO film 21 is disposed on a predetermined area of the surface channel layer 5. The LTO film 21 works as a mask for the ion implantation of N⁺ ions. Thus, the N⁺ conductive type source regions 4a, 4b are formed. At this time, the conditions of the ion implantation are such that the temperature is 700° C., and the dose amount of the ions is $1 \times 10^{15}$ cm⁻².

Figure 3B:
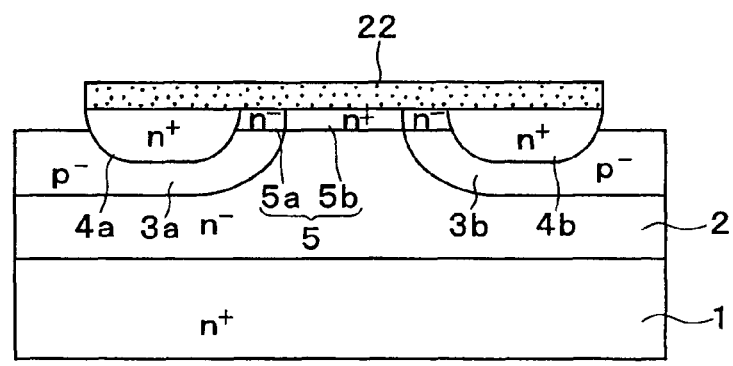

(Process Shown in FIG. 3B)

After the LTO film 21 is removed, another LTO film 22 is formed on a predetermined area of the surface channel layer 5 by using a photo resist method. The LTO film 22 works as a mask for reactive ion etching method. Thus, the surface channel layer 5 disposed on the P⁻ conductive type silicon carbide base regions 3a, 3b is partially etched and removed.

Figure 3C:
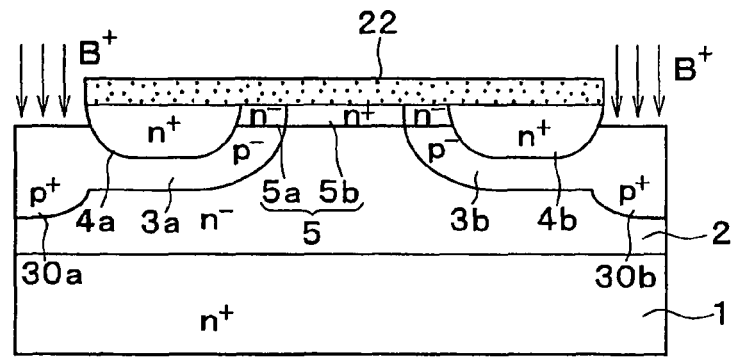

(Process Shown in FIG. 3C)

Further, B⁺ ions are implanted by using the LTO film 22 as a mask so that the deep base layers 30a, 30b are formed. Thus, a part of the base region 3a, 3b becomes thicker so that the deep base layer 30a, 30b is provided. The deep base layer 30a, 30b is formed on a portion, which does not overlap the N⁺ conductive type source region 4a, 4b. Further, the part of the P⁻ conductive type base region 3a, 3b, at which the deep base layer 30a, 30b is formed so that the thickness thereof becomes larger, has an impurity concentration higher than that of the other portion of the P⁻ conductive type base region 3a, 3b, at which the deep base layer 30a, 30b is formed so that the thickness thereof is thin.

Figure 4A:
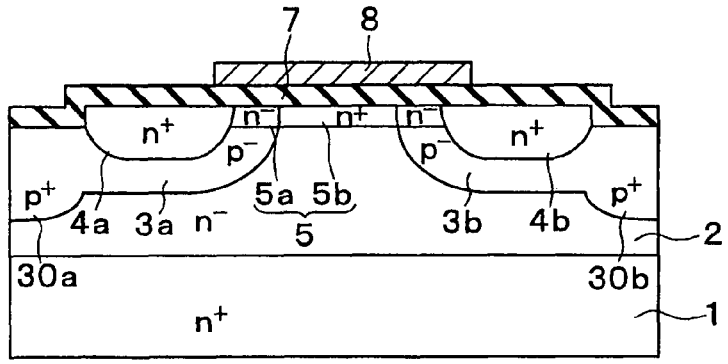

(Process Shown in FIG. 4A)

After the LTO film 22 is removed, the HfO₂ film as the high dielectric constant film is formed so that the gate insulation film 7 is formed on the substrate. At this time, for example, the HfO₂ film is formed by a sputtering method with a substrate temperature of 500° C. After sputtering, the substrate is processed with heat treatment in O₂ atmosphere if necessary.

Figure 4B:
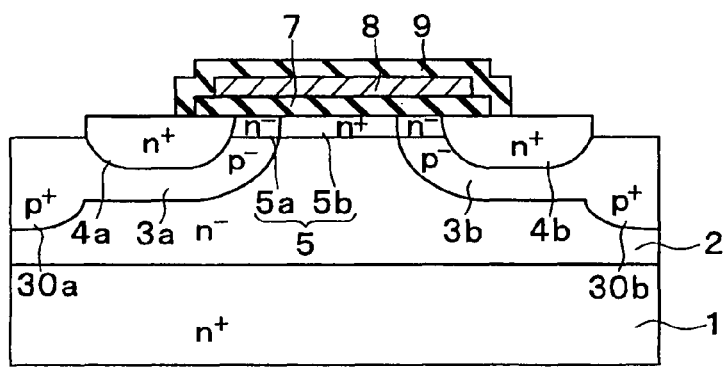

(Process Shown in FIG. 4B)

Successively, excess portion of the gate insulation film 7 is removed. Then, the insulation film 9 made of LTO is formed to cover the gate insulation film 7. At this time, the deposition temperature of LTO is set to be 425° C., and then, after the deposition, the substrate is annealed at 1000° C.

Figure 4C:
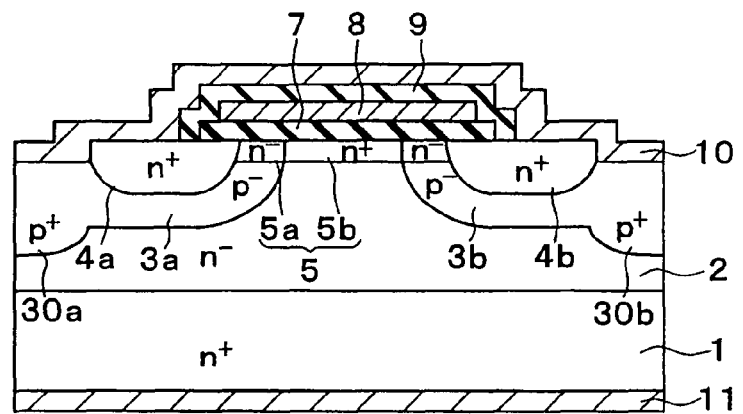

(Process Shown in FIG. 4C)

The source electrode 10 and the drain electrode 11 are formed at room temperature by a metallic sputtering method. Further, after sputtering, the substrate is annealed at 1000° C. Thus, the vertical type power MOSFET shown in FIG. 1 is completed.

Next, operation (i.e., function) of the vertical type power MOSFET is described. The MOSFET functions in the normally off type accumulation mode. When no voltage is applied to the poly-crystal silicon gate electrode, a carrier in the surface channel layer 5 is depleted in all area of the surface channel layer 5 by the difference of electrostatic potential between the P⁻ conductive type base region 3a, 3b and the surface channel layer 5 and by the difference of work function between the surface channel layer 5 and the poly-crystal silicon gate electrode 8. When the voltage is applied to the poly-crystal silicon gate electrode 8, the electric potential generated from sum of the applied voltage from the external circuit and the difference of work function between the surface channel layer 5 and the poly-crystal silicon gate electrode 8 is changed. Thus, the state of the channel is controlled.

Specifically, the work function of the poly-crystal silicon gate electrode 8 is defined as the first work function, the work function of the P⁻ conductive type base region 3a, 3b is defined as the second work function, and the work function of the surface channel layer 5 is defined as the third work function. In this case, the first to third work functions, the impurity concentration and the thickness of the surface channel layer 5 are determined in such a manner that the N conductive type carrier in the surface channel layer 5 is depleted by using the first to third work functions.

When the device is in the off state, the depletion region is formed in the surface channel layer 5 by the electric field generated by the P⁻ conductive type base region 3a, 3b and by the poly-crystal silicon gate electrode 8. When the positive bias is applied to the poly-crystal silicon gate electrode 8 in the above state, the channel region is formed at the interface between the gate insulation film (i.e., $SiO_2$) 7 and the surface channel layer 5. The channel region extends in a direction from the N⁺ conductive type source region 4a, 4b to the N⁻ conductive type drift region 2. Thus, the device switches from the off state to the on state. At this time, electrons flow from the N⁺ conductive type source region 4a, 4b to the N⁻ conductive type epitaxial layer 2 through the surface channel layer 5. When the electrons reach the N⁻ conductive type epitaxial layer 2 (i.e., the drift region), the electrons flow into the N⁺ conductive type semiconductor substrate 1 composing the drain region in the vertical direction.

Thus, the positive voltage is applied to the gate electrode 8 so that the accumulation type channel is induced at the surface channel layer 5. Thus, the carrier flows between the source electrode 10 and the drain electrode 11.

Thus, in the planer type MOSFET, the operation mode becomes the accumulation mode, in which the channel is induced without reversing the conductive type of the channel-to-be-formed layer. Therefore, the channel mobility of the device is increased so that the on-state resistance is reduced, compared with a MOSFET having a reverse mode, in which the channel is induced with reversing the conductive type of the channel-to-be-formed layer.

Figure 5A:
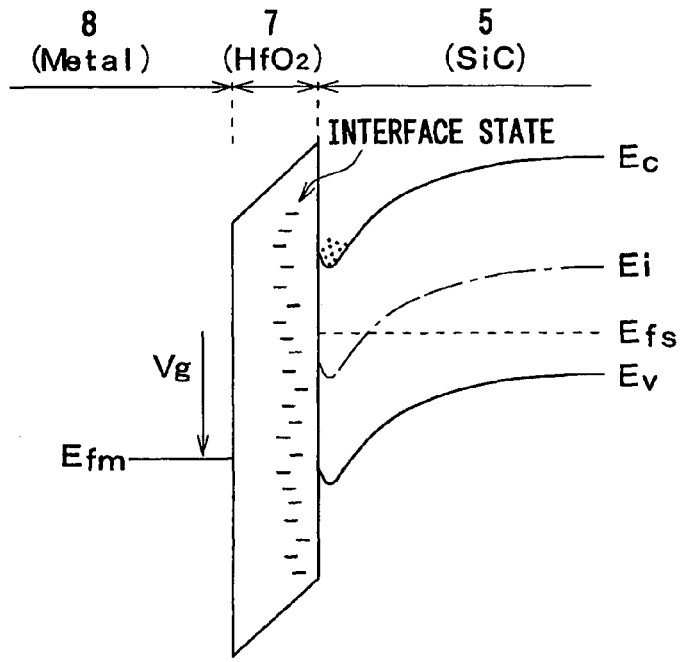
FIG. 5A shows an energy band structure in a case where a gate insulation film is composed of a high dielectric constant film.
Figure 5B:
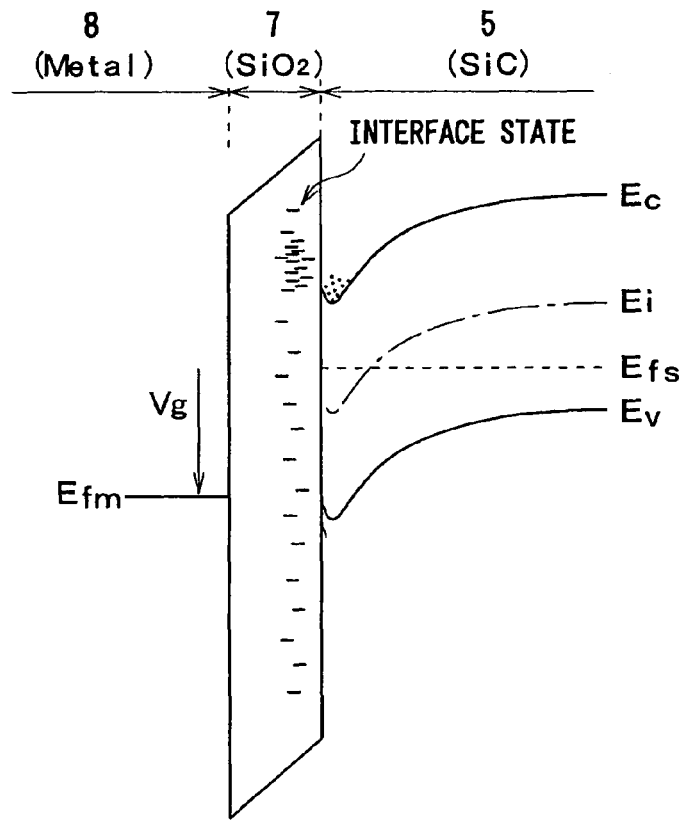
FIG. 5B shows another energy band structure in another case where the gate insulation film is composed of an oxide film (i.e., $SiO_2$)

In this embodiment, the gate insulation film 7 of the power MOSFET having the above construction is made of $HfO_2$ film as the high dielectric constant film. Here, FIG. 5A shows an energy band structure in a case where the gate insulation film 7 is made of the high dielectric constant film, and FIG. 5B shows an energy band structure in a case where the gate insulation film 7 is made of an oxide film (i.e., $SiO_2$) in a conventional art. FIGS. 5A and 5B shows the energy band at a cross sectional portion shown as V-V in FIG. 1.

When the gate insulation film 7 is made of the oxide film, as shown in FIG. 5B, the interface state of the negative charge is formed near the conduction band with high density. Thus, the interface state affects the current flow so that the channel mobility is reduced.

On the other hand, when the gate insulation film 7 is made of the high dielectric constant film, as shown in FIG. 5A, although the interface state exists, the interface state is not concentrated near the conduction band with high density. Thus, the interface state does not affect the current flow substantially, so that the channel mobility is not reduced.

As described above, in the power MOSFET according this embodiment, the gate insulation film 7 is made of the high dielectric constant film. Therefore, the interface state can not be concentrated near the conduction band with high density. Accordingly, the problem that the channel mobility is reduced by the influence of the interface state to current flow is solved. Thus, the channel mobility is improved.

(Modifications)

In the above first embodiment, although the $HfO_2$ film is used as the high dielectric constant film, which composing the gate insulation film 7, other high dielectric constant films can be used for the gate insulation film 7. For example, a HfAlOx film can be used for the high dielectric constant film. In this case, the HfAlOx film is formed in the step shown in FIG. 4A in the first embodiment by, for example, MO-CVD method. For example, the HfAlOx film is deposited at the temperature of 500° C. in $O_2$ atmosphere. After deposition, the substrate is processed with heat treatment at 700° C. Thus, the gate insulation film 7 is formed. Further, a HfSiON film can be used as the high dielectric constant film. For example, the HfSiON film is formed by a reactive sputtering method. Then, the substrate is processed with heat treatment at a temperature between 950° C. and 1100° C. in a $N_2$ gas atmosphere. Thus, the gate insulation film 7 is formed.

Second Embodiment

A second embodiment of the present invention is described. In this embodiment, the construction of the gate insulation film 7 is changed, compared with the first embodiment.

Figure 6:
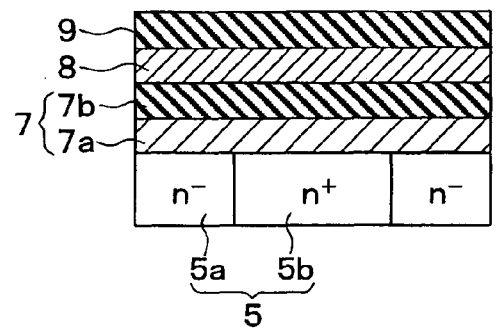
FIG. 6 is a partially enlarged cross sectional view showing a power MOSFET according to a second embodiment of the present invention.

FIG. 6 shows a partially enlarged view showing a part of the gate insulation film 7 of the power MOSFET according to this embodiment.

As shown in this drawing, in this embodiment, the gate insulation film 7 is composed of a stacked film, which is provided by stacking the high dielectric constant film 7a and the oxide film 7b. Specifically, the gate insulation film 7 is formed in such a manner that the high dielectric constant film 7a is formed on the surface of the surface channel layer 5, and then, the oxide film 7b is formed on the surface of the high dielectric constant film 7a.

Figure 7:
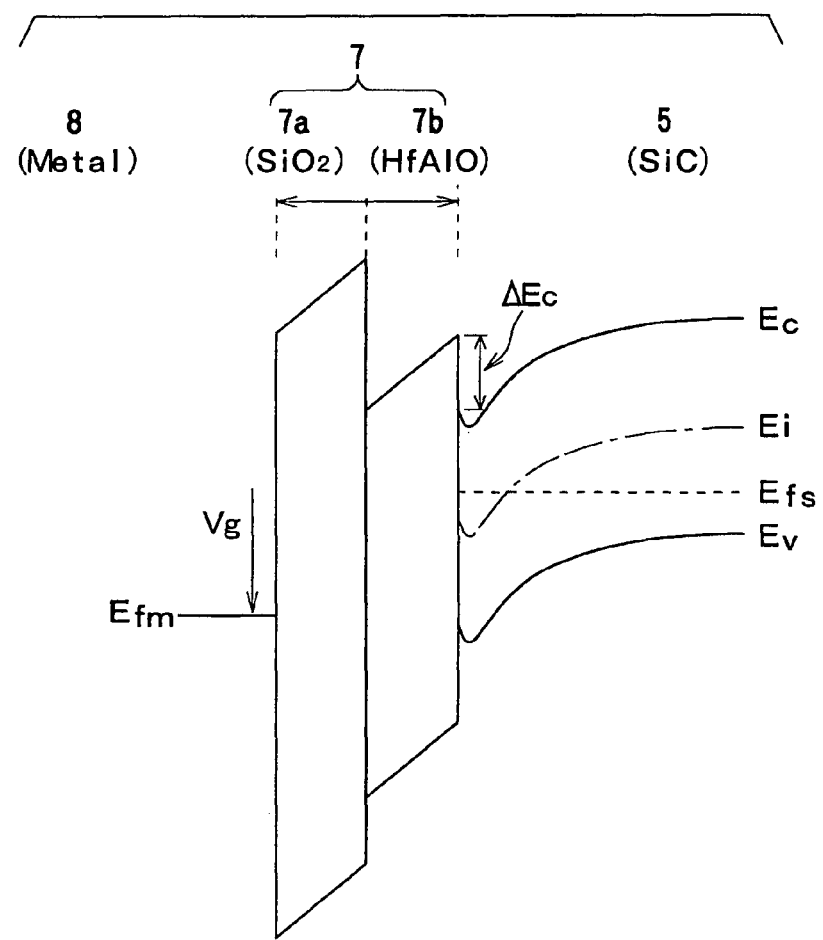
FIG. 7 shows an energy band structure near the gate insulation film in the power MOSFET shown in FIG. 6.

FIG. 7 shows an energy band structure in the above case. As shown in this drawing, in the high dielectric constant film 7a formed on the surface of the surface channel layer 5 made of silicon carbide, the interface state does not concentrate near the conduction band with high density.

However, when the gate insulation film 7 is formed of only the high dielectric constant film, a gate leakage current may flow largely under the high gate voltage application at a high temperature, compared with a case where the gate insulation film 7 is made of only the oxide film. This is because the difference ΔEc between the edge Ec of the energy level of silicon carbide on the conduction band side and the energy level Ec of the high dielectric constant film becomes smaller than the difference ΔEc between the energy level Ec of silicon carbide and the energy level Ec of the oxide film. Therefore, the energy barrier is easily exceeded, so that the gate leakage current flows largely.

Therefore, in this embodiment, a portion of the gate insulation film 7, which contacts the surface channel layer 5 is composed of the high dielectric constant film 7a. Further, the oxide film 7b is formed on the surface of the high dielectric constant film 7a. Thus, the interface state at the portion of the gate insulation film 7, which contacts the surface channel layer 5, does not concentrate near the conduction band with high density. Further, since the oxide film 7b is formed on the high dielectric constant film 7a, the difference ΔEc from the edge of the energy level of the silicon carbide becomes higher. Thus, the energy barrier, which is necessitated for generating the gate leakage current, becomes higher; and therefore, the gate leakage current is prevented from generating.

Here, the power MOSFET having the above construction can be manufactured by a method obtained by adding a wellknown oxide film formation process to the manufacturing method described in the first embodiment. For example, the high dielectric constant film 7a made of the HfAlOx film is formed at 500° C. in $O_2$ gas atmosphere by MO-CVD method. Then, the substrate is annealed at 700° C. Further, the oxide film 7b is deposited on the surface of the high dielectric constant film 7a by the CVD method. Thus, the gate insulation film 7 is formed. Further, a HfSiON film can be used as the high dielectric constant film. For example, the HfSiON film is formed by a reactive sputtering method. After that, the substrate is performed with heat treatment at a temperature between 950° C. and 1100° C. in $N_2$ gas atmosphere so that the gate insulation film 7 is formed.

Third Embodiment

A third embodiment of the present invention is explained as follows. This embodiment is obtained by changing the surface orientation of the $N^-$ conductive type semiconductor substrate 1 in the first embodiment.

In this embodiment, the $N^-$ conductive type semiconductor substrate 1 having the principal surface tilted by 10 degrees to 20 degrees from the (0001)-Si surface is prepared. The method for manufacturing this $N^-$ conductive type semiconductor substrate 1 is explained with reference to the manufacturing process chart shown in FIGS. 8A to 8C.

Figure 8A:
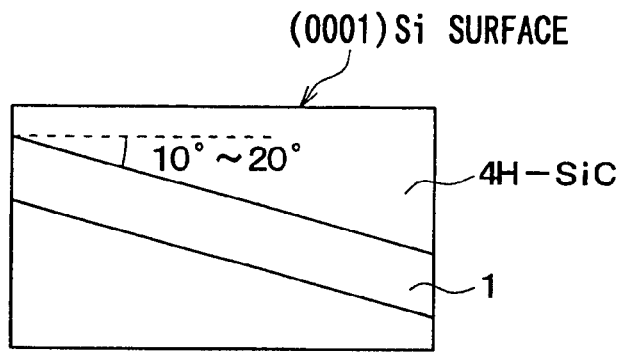
FIGS. 8A to 8C are cross sectional views explaining a method for manufacturing a N⁻ conductive type semiconductor substrate, according to a third embodiment of the present invention.
Figure 8B:
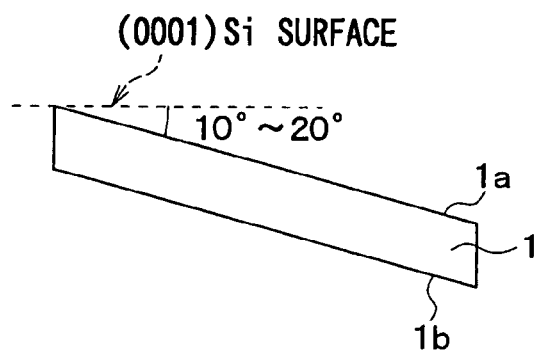

Firstly, as shown in FIG. 8A, a 4H-SiC single crystal ingot having the (0001)-Si surface is prepared. Then, as shown in FIG. 8B, the ingot is cut by using a wire saw at a surface tilted by 10 degrees to 20 degrees from the (0001)-Si surface. At this time, the surface tilted by 10 degrees to 20 degrees from the (0001)-Si surface has high stability so that a mirror surface without polishing defect is obtained. Thus, the $N^-$ conductive type semiconductor substrate 1 having the principal surface tilted by 10 degrees to 20 degrees from the (0001)-Si surface is prepared.

Figure 8C:
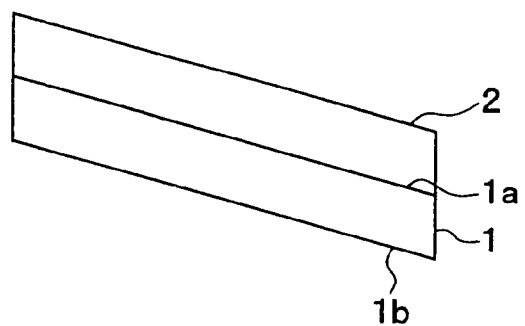

Then, as shown in FIG. 8C, the $N^-$ conductive type epitaxial layer 2 is epitaxially grown on the principal surface of the $N^-$ conductive type semiconductor substrate 1 by using CVD equipment or the like. After that, processes similar to the processes shown in FIGS. 2A to 3C are performed. Thus, the power MOSFET described in the first is completed.

The surface tilted by 10 degrees to 20 degrees from the (0001)-Si surface can reduce the interface state, compared with other surfaces. Therefore, the influence of the interface state to the current flow is much reduced. Thus, the channel mobility of the power MOSFET can be much improved.

Here, as described in this embodiment, when the $N^-$ conductive type semiconductor substrate 1 having the surface tilted by 10 degrees to 20 degrees from the (0001)-Si surface is used, it is preferred that the surface tilts along with a <11-20>-direction. It is confirmed by experiments that the interface state of the surface tilted along with the <11-20>-direction becomes lower. Thus, the surface tilted by 10 degrees to 20 degrees from the (0001)-Si surface is the surface tilted along with a <11-20>-direction, so that the interface state becomes smaller. Therefore, the channel mobility of the power MOSFET can be improved more effectively.

When the $N^-$ conductive type semiconductor substrate 1 having the surface tilted by 10 degrees to 20 degrees from the (0001)-Si surface is used, preferably, the surface is a (11-2N)-surface, wherein N satisfies a relationship of $17 \leq N \leq 38$. It is confirmed by experiments that the interface state of the (11-2N)-surface, wherein N satisfies a relationship of $17 \leq N \leq 38$, is reduced. Therefore, when this surface is used, the channel mobility of the power MOSFET can be improved more effectively.

Fourth Embodiment

A fourth embodiment of the present invention is explained as follows. This embodiment, which is similar to the third embodiment, is obtained by changing the surface orientation of the $N^-$ conductive type semiconductor substrate 1 in the first or the second embodiment.

Figure 9A:
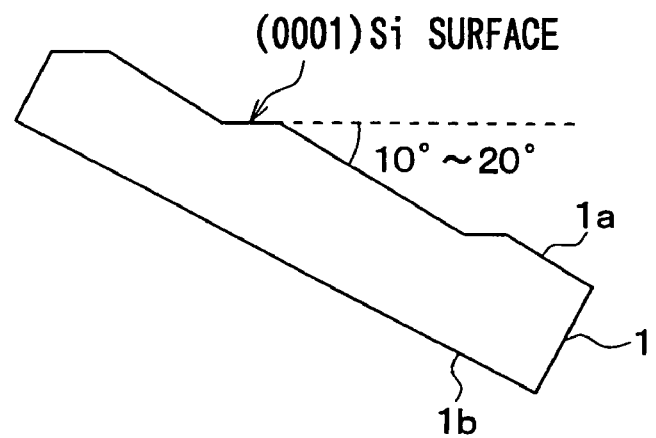
FIGS. 9A and 9B are cross sectional views explaining a method for manufacturing a power MOSFET according to a fourth embodiment of the present invention.
Figure 9B:
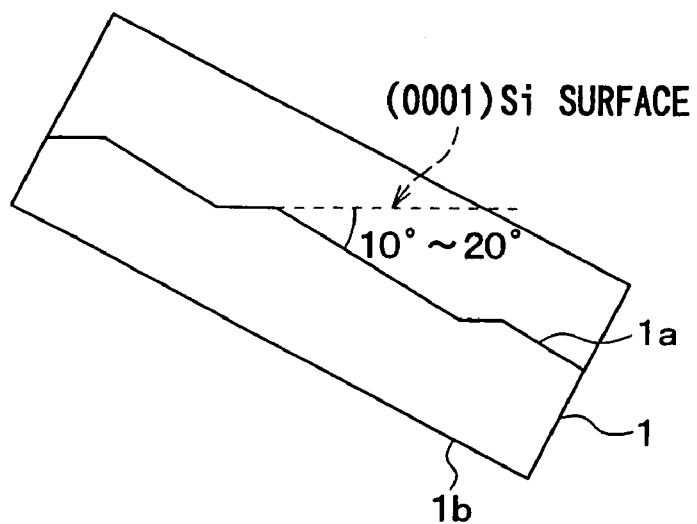

FIGS. 9A and 9B show a manufacturing process of the power MOSFET according to this embodiment. In this embodiment, firstly, as shown in FIG. 9A, an offset substrate as the $N^-$ conductive type semiconductor substrate 1 is prepared. The offset substrate has an offset of 8 degrees from the (0001)-Si surface.

Next, the LTO film is formed on the surface of the $N^-$ conductive type semiconductor substrate 1. Then, the LTO film is removed. Further, the surface of the $N^-$ conductive type semiconductor substrate 1 is cleaned. Then, a silicon carbide layer having a thickness of, for example, 5 nm is deposited on the surface of the $N^-$ conductive type semiconductor substrate 1. Successively, a high vacuum chamber is heated so that the temperature of the $N^-$ conductive type semiconductor substrate 1 holds in a range between 500° C. and 1100° C. Preferably, the temperature holds a constant temperature about 1500° C. This high temperature treatment provides a step bunching disposed on the surface of the $N^-$ conductive type semiconductor substrate 1. Therefore, two surfaces, one of which is the (0001)-Si surface and the other one of which is the surface tilted by 10 degrees to 20 degrees from the (0001)-Si surface, are obtained.

At this time, the area of the surface tilted by 10 degrees to 20 degrees from the (0001)-Si surface becomes larger than the area of the (0001)-Si surface. The relationship of the area ratio can be controlled by temperature control of the heat treatment process. For example, two or more heat treatment processes, such as one of which is performed at 1050° C. and the other one of which is performed at 950° C., are combined so that the relationship of the area ratio can be controlled.

The (0001)-Si surface and the surface tilted by 10 degrees to 20 degrees from the (0001)-Si surface are formed as the principal surface 1a of the $N^-$ conductive type semiconductor substrate 1. Then, the $N^-$ conductive type semiconductor substrate 1 having these two surfaces is used so that the power MOSFET having the construction described in the first embodiment is manufactured.

After that, as shown in FIG. 9B, the $N^-$ conductive type epitaxial layer 2 is epitaxially grown on the principal surface of the $N^-$ conductive type semiconductor substrate 1 by using CVD equipment or the like. Then, processes similar to the processes shown in FIGS. 2A to 3C are performed. Thus, the power MOSFET described in the first embodiment is completed.

After that, the $N^-$ conductive type epitaxial layer 2 is epitaxially grown on the principal surface of the $N^-$ conductive type semiconductor substrate 1 by using CVD equipment or the like. Then, processes similar to the processes shown in FIGS. 2A to 3C are performed. Thus, the power MOSFET described in the first embodiment is completed.

It is confirmed that the single crystal silicon carbide substrate having the principal surface of the (0001)-Si surface and the surface tilted by 10 degrees to 20 degrees from this surface can reduce the interface state, compared with the single crystal silicon carbide substrate having the principal surface of the other surfaces. Therefore, the influence of the interface state to the current flow can be much reduced. Thus, the channel mobility of the power MOSFET can be much improved.

Further, the area of the surface tilted by 10 degrees to 20 degrees from the (0001)-Si surface is larger than the area of the (0001)-surface; and therefore, the above effect can be obtained effectively.

(Modifications)

In the above embodiments, the surface channel layer 5 is formed in such a manner that the ions are implanted directly on the surface portion of the N⁻ conductive type silicon carbide epitaxial layer 2 and on the surface portion (i.e., surface layer) of the P⁻ conductive type silicon carbide base regions 3a, 3b. The above embodiments can be applied to a power MOSFET manufactured in such a manner that the N⁻ conductive type surface channel layer 5 is grown epitaxially on these surface portions.

Further, in the above embodiments, the power MOSFET having the first conductive type as the N conductive type and the second conductive type as the P conductive type is described as an example. However, this is an example; and therefore, the present invention can be applied to a P channel type power MOSFET, which is obtained by reversing a conductive type of each part.

Figure 20:
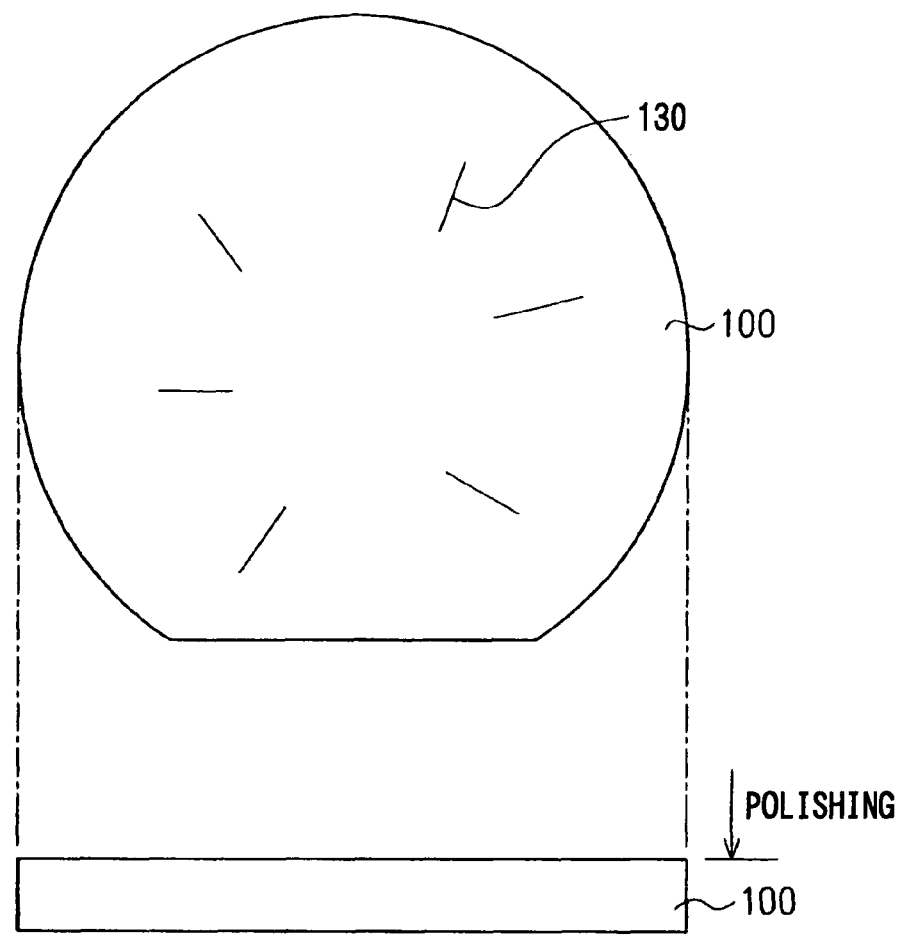
FIG. 20 is a schematic view showing a cross sectional view and a plan view of a wafer according to a comparison of the fifth embodiment.
Figure 21:
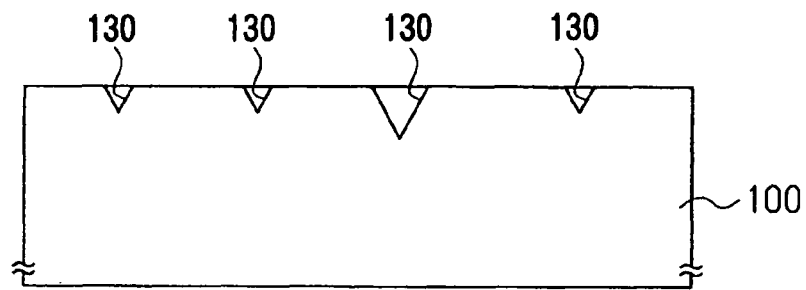
FIG. 21 is a vertical cross sectional view showing the wafer according to the comparison of the fifth embodiment.
Figure 22:
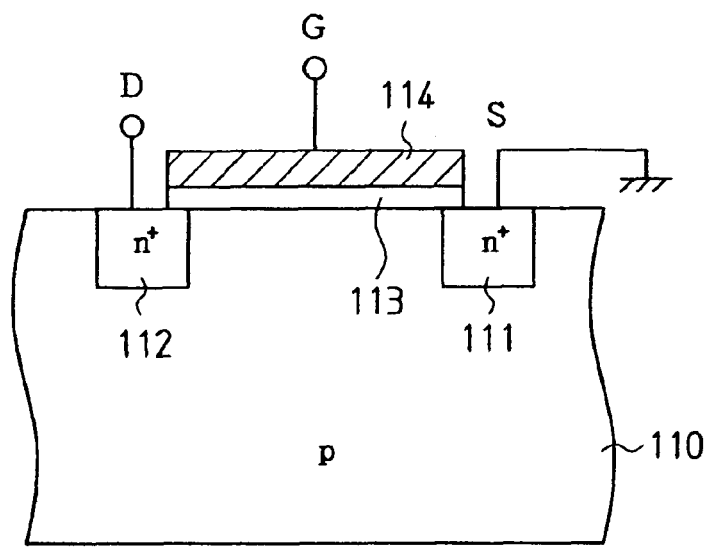
FIG. 22 is a vertical cross sectional view showing a MOS transistor, according to the comparison of the fifth embodiment.
Figure 23:
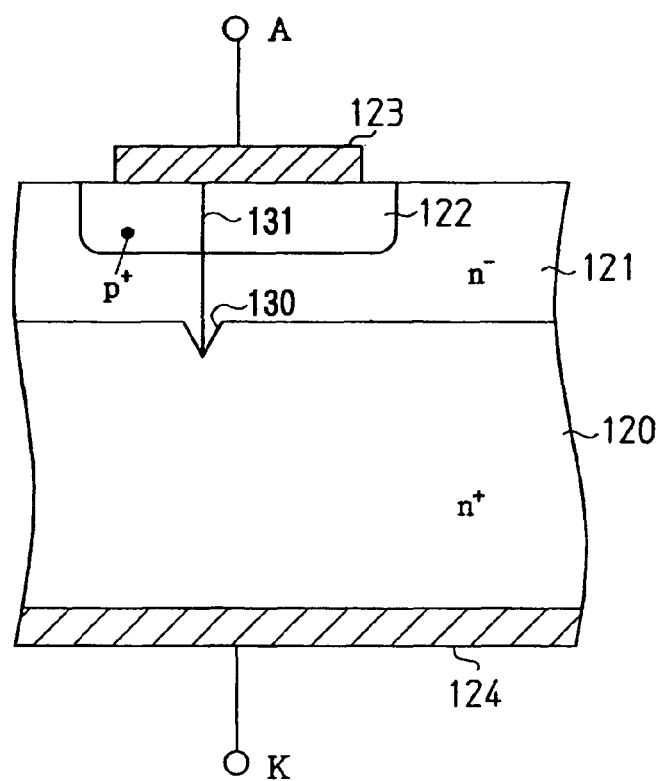
FIG. 23 is a vertical cross sectional view showing a diode, according to the comparison of the fifth embodiment.

Here, when a crystal orientation is defined, in general, a bar (−) should be added on a numeral. However, an expressional limitation derived from a computer filing system exists. Therefore, in this specification, the bar is added in front of the numeral Fifth Embodiment The inventors have preliminarily studied about a SiC substrate. An eight-degree offset surface of the SiC substrate is not a stable surface. Therefore, as shown in FIGS. 20 and 21, a defect caused by polishing is easily generated when a wafer 100 is processed. Thus, it is difficult to form homogeneous surface state in a wafer surface. Therefore, for example, as shown in FIG. 22, a device fault is occurred at a portion of a substrate 110 having bad surface state such as a defect 130 caused by polishing in a MOS transistor. The MOS transistor includes a source region 111, a drain region 112, a gate oxide film 113, and a gate electrode 114 formed on a surface portion of the substrate 110. In detail, when the defect 130 caused by polishing is disposed on the surface of the substrate 110, current leakage is easily occurred at the gate oxide film 113. Further, when a device is formed in the SiC substrate after epitaxial growth, for example, as shown in FIG. 23, a crystal defect 131 due to the defect 130 caused by polishing on the surface of the substrate 120 may generate in the epitaxial layer 121 of the device (i.e., diode), so that current leakage (i.e., a PN junction leakage) is easily occurred. The device has the epitaxial layer 121 on the substrate 120, in which a P conductive type region 122 is formed, and has an anode electrode 123 and a cathode electrode 124.

In view of the above problem, a silicon carbide semiconductor substrate and a method for manufacturing the substrate are explained with reference to FIGS. 10A to 10C.

Figure 10A:
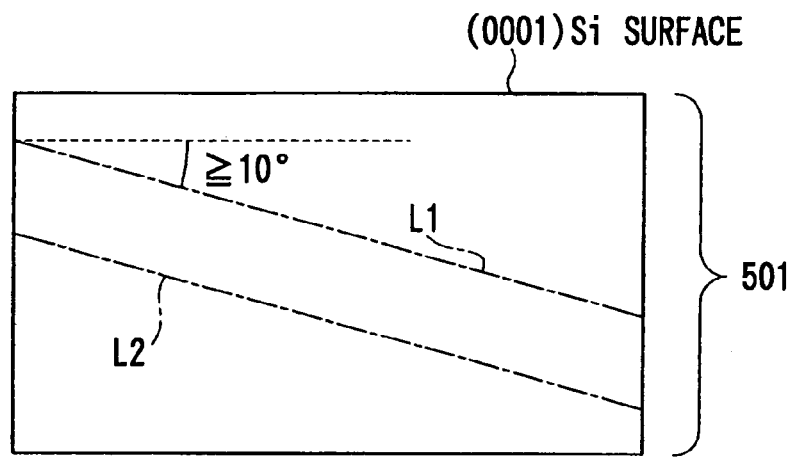
FIGS. 10A to 10C are vertical cross sectional views explaining a method for manufacturing a silicon carbide semiconductor substrate according to a fifth embodiment of the present invention.

As shown in FIG. 10A, a 4H-SiC single crystal substrate 501 is prepared. The surface tilted by 10 degrees to 20 degrees from the (0001)-Si surface of the 4H-SiC single crystal substrate 501 is cut from the 4H-SiC single crystal substrate 501 by using a wire saw. Specifically, the substrate 501 is cut by the wire saw at a pair of lines shown as L1 and L2 in FIG. 10A. As a result, the substrate 1 shown in FIG. 10B is obtained.

Further, the surface of the substrate 1 is mirror-polished by a chemical mechanical planarization method with diamond abrasive. At this time, the surface of the substrate 1 tilted by 10 degrees to 20 degrees from the (0001)-Si surface becomes a mirror finished surface without defect caused by polishing, so that the stability of the surface becomes higher.

Figure 10B:
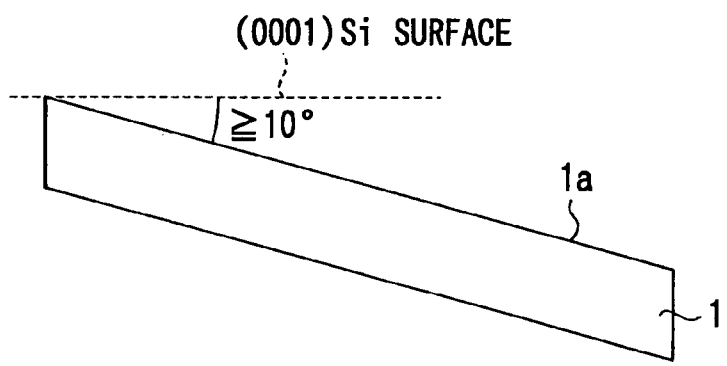
Figure 10C:
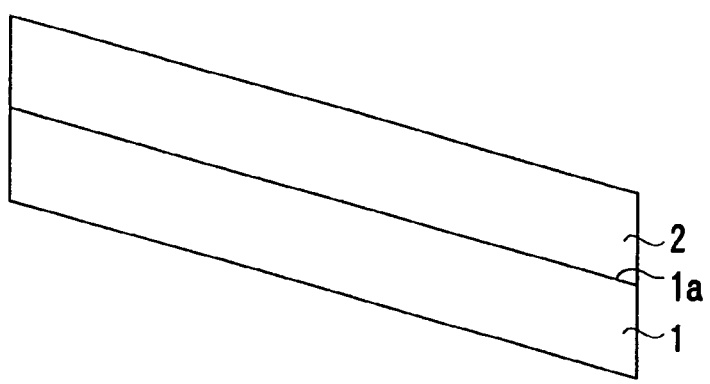

Successively, as shown in FIG. 10C, an epitaxial film is grown on the principal surface of the substrate 1 by using CVD equipment so that the epitaxial layer 2 is formed on the substrate 1.

Figure 11:
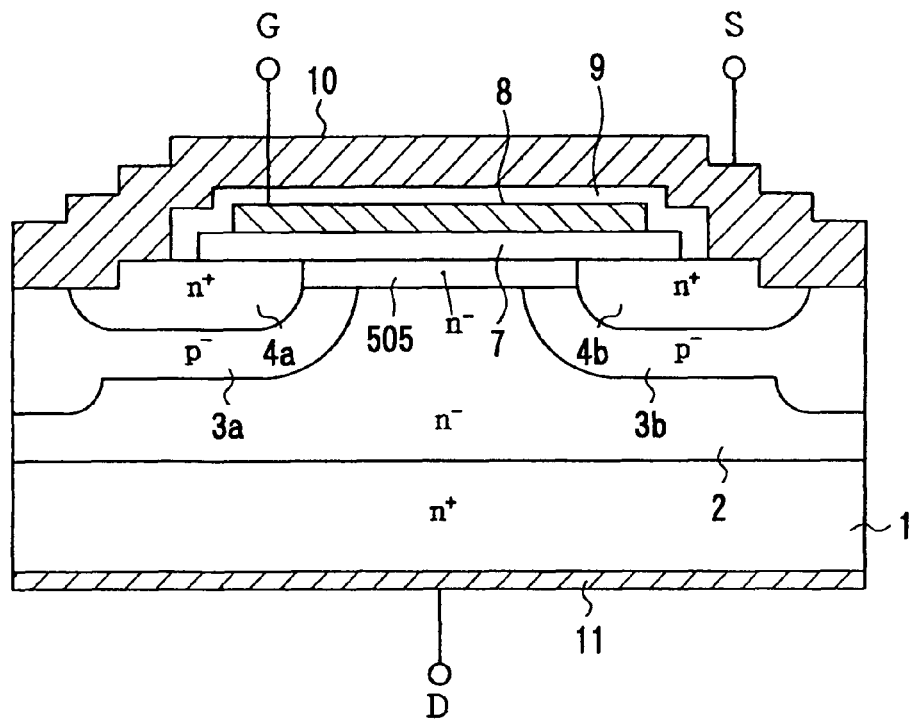
FIG. 11 is a cross sectional view showing a silicon carbide semiconductor device, according to the fifth embodiment.

By using this substrate, the vertical power MOS transistor shown in FIG. 11 is formed. Specifically, the N⁻ conductive type region 2 is epitaxially grown on the N⁺ conductive type SiC substrate 1. The P⁻ conductive type region 3a, 3b is formed on the surface portion of the principal surface of the substrate (i.e., the upper surface of the N⁻ conductive region 2), and further, the N⁺ conductive type source region 4a, 4b is formed on the surface portion of the P⁻ conductive region 3a, 3b. Further, a low concentration layer as a N⁻ conductive type surface channel layer 505 is formed in the channel region of the surface portion of the N⁻ conductive type region 2. The gate electrode 8 is formed on the low concentration layer 505 through the gate oxide film (i.e., in general, the gate insulation film) 7. The source electrode 10 is formed on the gate electrode 8 through the insulation film 9 so that the source electrode 10 contacts the N⁺ conductive type source region 4a, 4b and the P⁻ conductive type region 3a, 3b. On the other hand, the drain electrode 11 is formed on the lower surface (i.e., the bottom) of the N⁺ conductive type SiC substrate 1.

Figure 12:
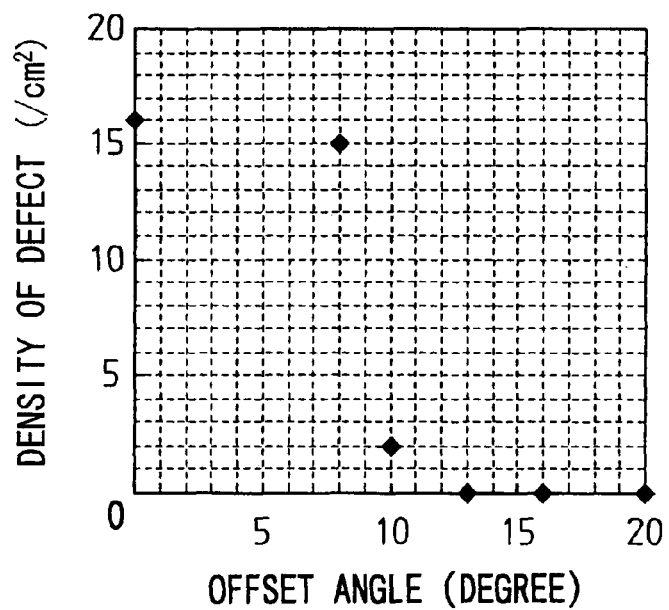
FIG. 12 is a graph showing a measurement result of an offset angle of the substrate and density of defect caused by polishing, according to the fifth embodiment.

FIG. 12 shows a result of measurement of a relationship between the offset angle and the density of defect caused by polishing. Here, various substrates having different offset angles are prepared. The horizontal axis in FIG. 12 represents the offset angle of the substrate, and the vertical axis in FIG. 12 represents the density of defect caused by polishing. As shown in FIG. 12, when the offset angle becomes equal to or larger than 10 degrees, the defect caused by polishing is rapidly reduced. Further, when the offset angle becomes equal to or larger than 10 degrees, the roughness of the substrate surface is reduced. Further, when the offset angle becomes equal to or larger than 13 degrees, the defect caused by polishing disappears.

Accordingly, the principal surface of the silicon carbide semiconductor substrate is designed to be the surface tilted by 10 degrees or more from the (0001)-Si surface, so that the principal surface becomes stable. Specifically, it is preferred that the principal surface is designed to be the surface tilted by 10 degrees to 20 degrees from the (0001)-Si surface. More preferably, the principal surface is designed to be the surface tilted by 13 degrees to 20 degrees from the (0001)-Si surface. By using this surface, the epitaxial growth layer having small amount of the crystal defect is formed. Specifically, when the epitaxial substrate is manufactured, the defect caused by polishing can be reduced (i.e., the roughness is reduced) so that the well-regulated surface state is formed before the epitaxial film is grown. Thus, the epitaxial film is grown under the condition that the generation of the crystal defect is limited. That is, the process yielding ratio of the device is improved (i.e., the generation ration of the chip failure in the wafer is reduced).

Here, the vertical power MOS transistor shown in FIG. 11 is formed by using the substrate 1 shown in FIG. 10C. However, the MOS transistor shown in FIG. 22 can be formed by using the substrate shown in FIG. 10B. Further, the ingot to be cut into the substrate can be a 6H-SiC crystal instead of 4H-SiC crystal.

As described above, this embodiment has the following characteristics.

(I) As shown in FIG. 10B, the silicon carbide semiconductor substrate 1 has the principal surface tilted by 10 degrees or more from the (0001)-Si surface. Therefore, the surface has excellent surface state and excellent regularity with suppressing a defect, compared with an eight-degree offset substrate, which is a silicon carbide semiconductor substrate having a principal surface tilted by 8 degrees from the (0001)-Si surface. Thus, the surface has homogeneous and stable surface state in an area of a substrate surface so that the surface provides a semiconductor-device-to-be-formed surface.

Here, preferably, the angle equal to or larger than 10 degrees is in a range between 10 degrees and 20 degrees. More preferably, the angle equal to or larger than 10 degrees is in a range between 13 degrees and 20 degrees. Further, the angle equal to or larger than 10 degrees is in a range between 16 degrees and 20 degrees from the (0001)-Si surface. Further, the surface tilted by 10 degrees or more from the (0001)-Si surface in the silicon carbide semiconductor substrate is a (11-2N)-surface, wherein the N satisfies a relationship of $17 \leq N \leq 38$.

(II) As shown in FIG. 10C, the epitaxial layer 2 is formed on the principal surface 1a of the silicon carbide semiconductor substrate 1 so that the epitaxial substrate is obtained. Thus, the epitaxial layer 2 has excellent surface state, and further, generation of crystal defect can be prevented.

(III) As shown in FIGS. 10A and 10B, a method for manufacturing a silicon carbide semiconductor substrate includes the steps of: the first step of preparing the silicon carbide semiconductor substrate 1 having the principal surface tilted by 10 degrees or more from a (0001)-Si surface by a scribing method; the second step of mirror-polishing the principal surface 1a of the silicon carbide semiconductor substrate 1; and the third step of forming the epitaxial layer 2 on the principal surface 1a in such a manner that the epitaxial layer is epitaxially grown on the principal surface 1a of the silicon carbide semiconductor substrate 1. The method provides the silicon carbide semiconductor substrate described in (III).

Here, preferably, the angle equal to or larger than 10 degrees is in a range between 10 degrees and 20 degrees. More preferably, the angle equal to or larger than 10 degrees is in a range between 13 degrees and 20 degrees. Further, the angle equal to or larger than 10 degrees is in a range between 16 degrees and 20 degrees from the (0001)-Si surface.

Sixth Embodiment

Next, a sixth embodiment is explained as follows.

A silicon carbide semiconductor substrate and a method for manufacturing the same are explained with reference to FIGS. 13A and 13B.

Figure 13A:
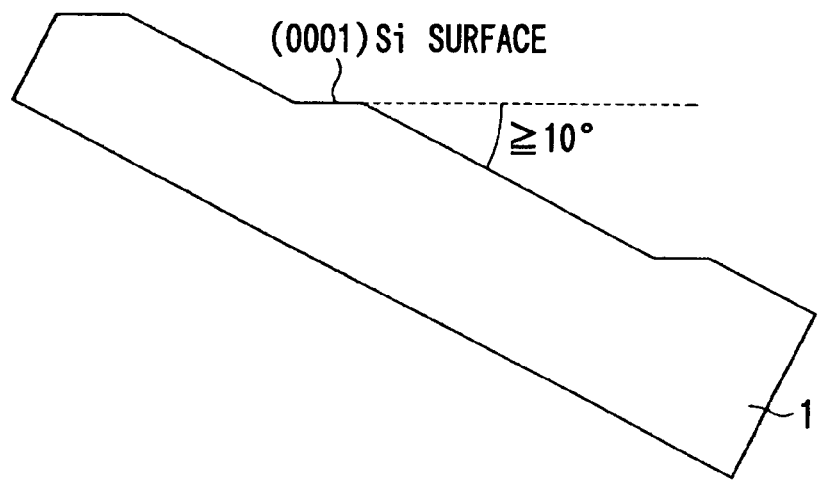
FIGS. 13A and 13B are vertical cross sectional views explaining a method for manufacturing a silicon carbide semiconductor substrate according to a sixth embodiment of the present invention.

As shown in FIG. 13A, the principal surface of the silicon carbide semiconductor substrate 1 is composed of at least two surface, one of which is the (0001)-Si surface, and the other one of which is a surface tilted by 10 degrees or more from the (0001)-Si surface. Here, preferably, the principal surface is composed of at least two surfaces, one of which is the (0001)-Si surface, and the other one of which is a-surface tilted by 10 degrees to 20 degrees from the (0001)-Si surface. More preferably, the principal surface is composed of at least two surfaces, one of which is the (0001)-Si surface, and the other one of which is a surface tilted by 13 degrees to 20 degrees from the (0001)-Si surface. This is derived from the ground of the relationship between the density of defect caused by polishing and the angle from the (0001)-Si surface, as described above with reference to FIG. 12.

Figure 13B:
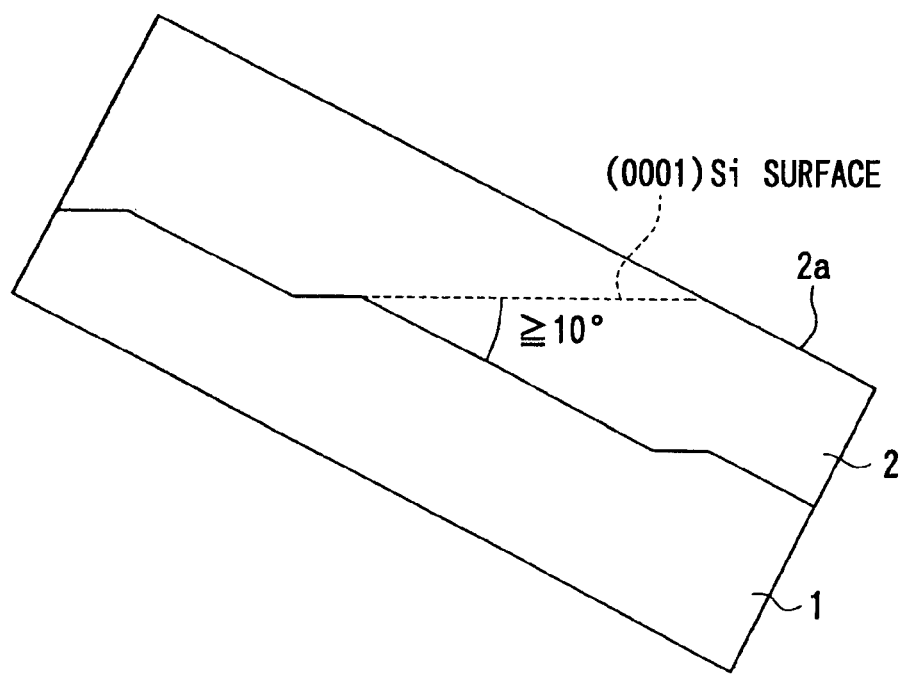

As shown in FIG. 13B, the epitaxial layer 2 is formed on the principal surface of the silicon carbide semiconductor substrate 1 as a single crystal. Specifically, as shown in FIG. 13A, the substrate 1 having the substrate surface, on which two surfaces of the (0001)-Si surface and the surface tilted by 10 degrees or more from the (0001)-Si surface are formed, is prepared. The epitaxial layer 2 is grown on the substrate 1 by using the CVD equipment.

To obtain the substrate shown in FIG. 13A, the following process is performed.

Figure 14A:
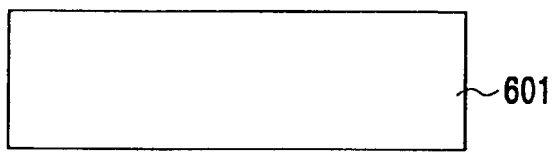
FIGS. 14A to 14F are vertical cross sectional views explaining the method for manufacturing the silicon carbide semiconductor substrate according to the sixth embodiment.
Figure 14B:
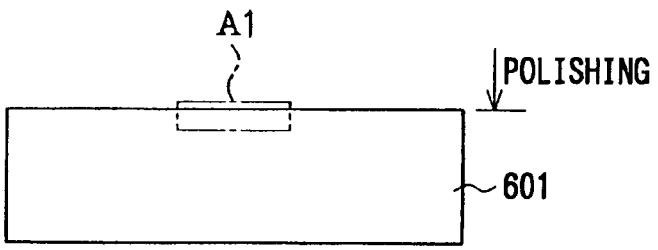
Figure 14C:
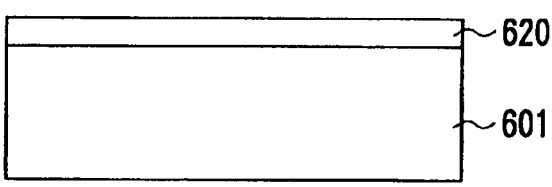
Figure 14D:
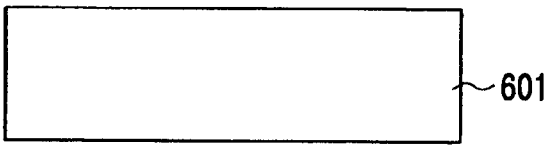

As shown in FIGS. 14A to 14F, the SiC substrate 601 such as an eight-degree offset substrate is prepared. The substrate 601 has the principal surface tilted by a predetermined angle from the (0001)-Si surface. The, as shown in FIG. 14B, the surface of the substrate 601 is polished to be a mirror-finished surface. At this time, as shown in FIG. 21, a defect caused by polishing remains on the surface portion of the substrate 601 (i.e., the surface portion shown as A1 in FIG. 14B). Further, as shown in FIG. 14C, a LTO film 620 is formed on the surface of the substrate 601. Then, the LTO film 620 is removed so that the substrate becomes a state shown in FIG. 14D. After that, the surface of the SiC substrate 601 is cleaned.

Figure 14E:
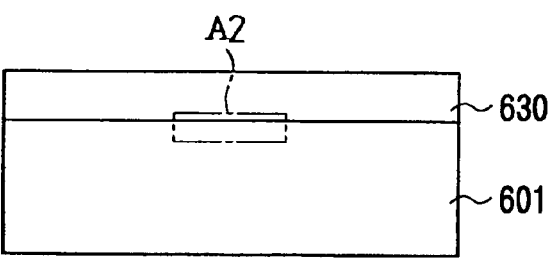
Figure 14F:
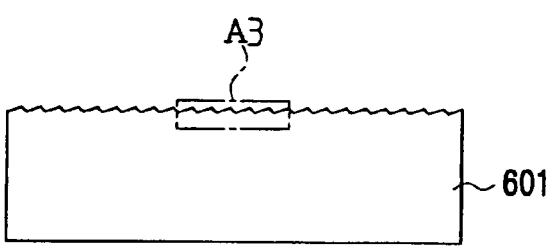

Further, as shown in FIG. 14E, a Si layer 630 having a thickness of about 5 nm is deposited on the surface of the SiC substrate 601 by an evaporation method and the like. Successively, an ultra high vacuum chamber is heated so that the temperature of the SiC substrate 601 becomes constant in a range between 500° C. and 1500° C. (i.e., the temperature of the substrate 601 becomes higher). At this time, preferably, the temperature is set to be 1050° C. This temperature increasing provides a step bunching on the substrate surface, as shown in FIG. 14F.

Figure 15:
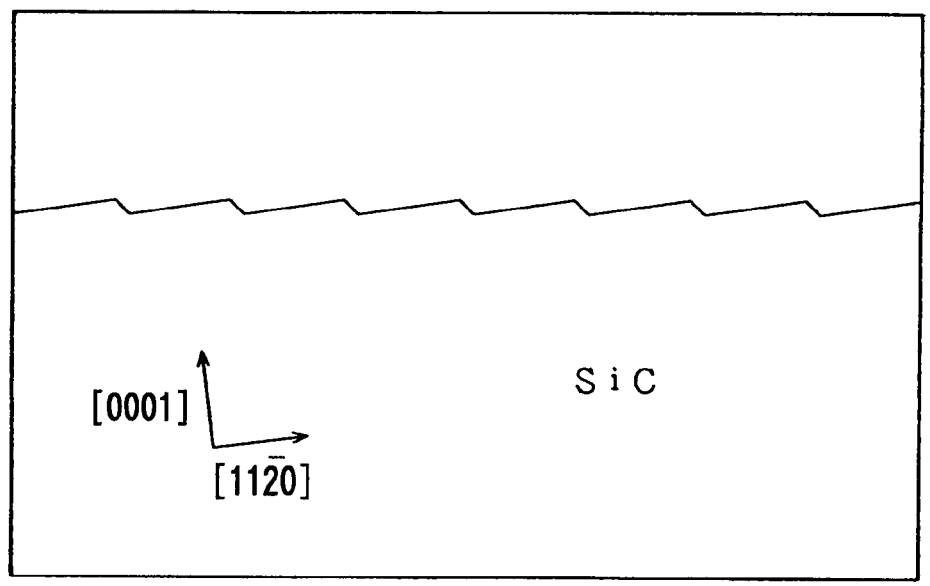
FIG. 15 is a cross sectional view explaining a construction of a substrate surface, according to the sixth embodiment.
Figure 16:
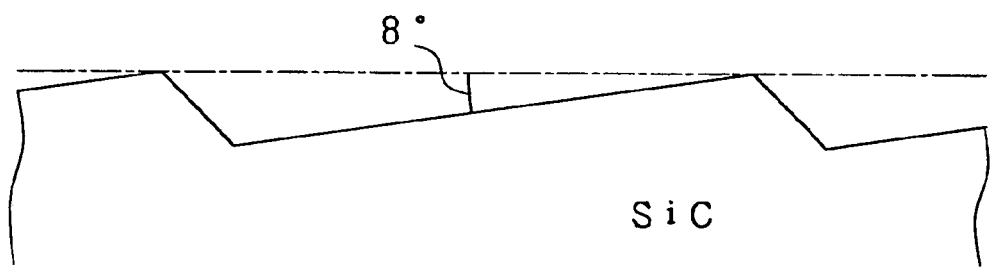
FIG. 16 is a cross sectional view explaining the construction of the substrate surface, according to the sixth embodiment.
Figure 17:
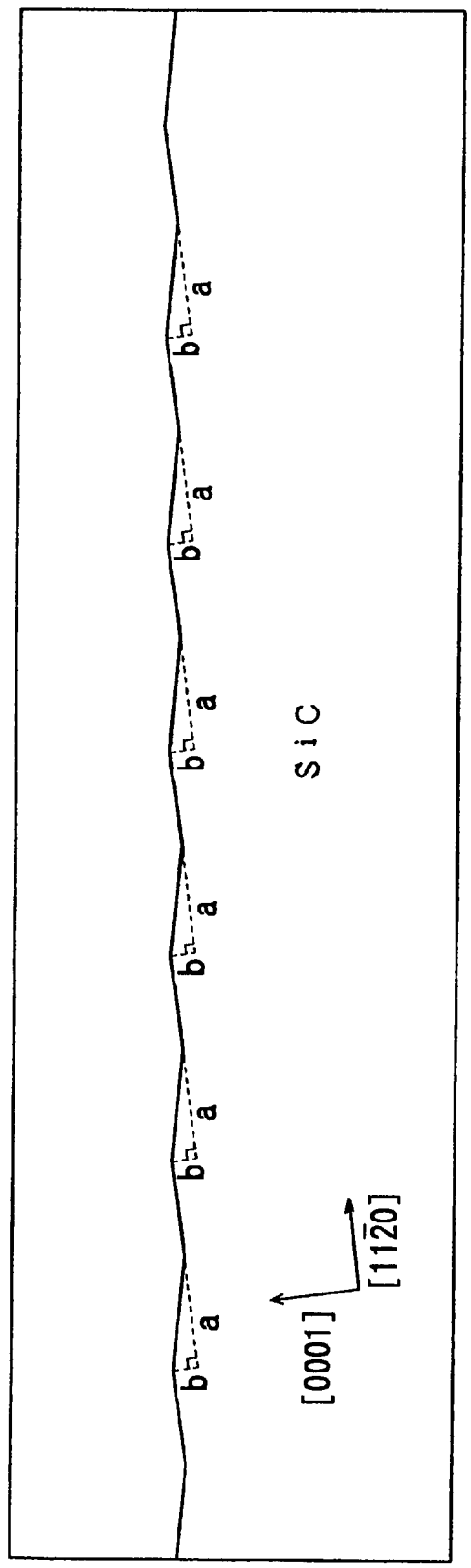
FIG. 17 is a cross sectional view explaining the construction of the substrate surface, according to the sixth embodiment.
Figure 18:
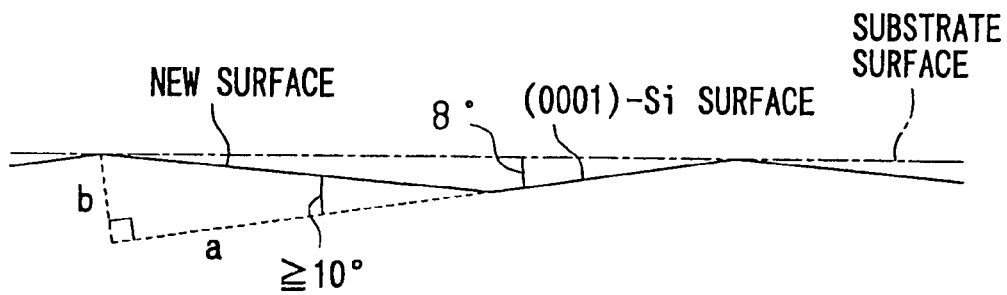
FIG. 18 is a cross sectional view explaining the construction of the substrate surface, according to the sixth embodiment.

The detail is described as follows. As shown in FIG. 15, which is obtained by enlarging the substrate surface in FIG. 14E (i.e., a portion shown as A2), the eight-degree offset substrate has the surface construction shown in FIG. 16. The substrate in this state is performed with high temperature treatment, so that the step bunching is formed, as shown in FIG. 17, which is obtained by enlarging the substrate surface in FIG. 14F (i.e., a portion shown as A3). Thus, the substrate surface becomes the surface construction shown in FIG. 18. Thus, the step bunching having a relationship of $\tan^{-1}(b/a) \leq 10$ degrees concerning to the (0001)-Si surface is formed. Thus, the new surface of the step bunching is tilted by 10 degrees or more from the (0001)-Si surface.

Figure 19A:
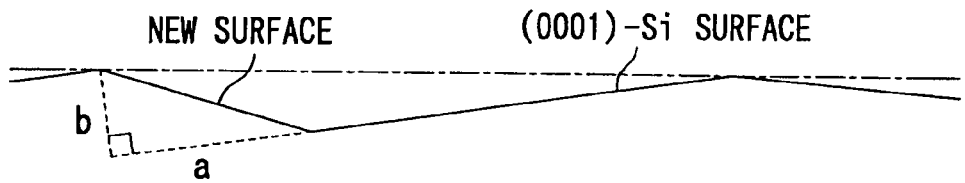
FIGS. 19A and 19B are cross sectional views explaining the construction of the substrate surface, according to the sixth embodiment.
Figure 19B:
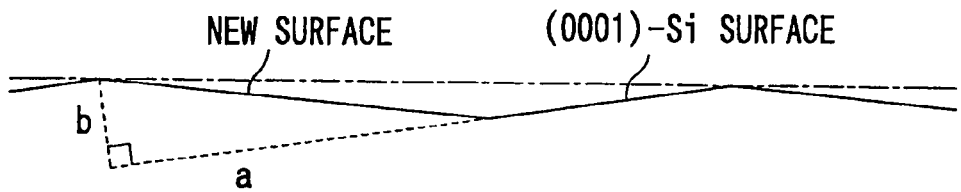

At this time, the area of the (0001)-Si surface and the area of the surface tilted by 10 degrees or more from the (0001)-Si surface are determined as follows. As shown in FIG. 19B, it is preferred that the area of the surface tilted by 10 degrees or more from the (0001)-Si surface is larger than the area of the (0001)-Si surface, compared with a case where the area of the surface tilted by 10 degrees or more from the (0001)-Si surface is smaller than the area of the (0001)-Si surface, as shown in FIG. 19A.

Further, when the step bunching is formed, the surface construction is restructured so that the defect caused by polishing disappears. Thus, the surface becomes stable.

As shown in FIG. 14E, the Si layer 630 is deposited on the substrate surface before the temperature of the substrate becomes higher. This is because the substrate surface is protected from being carbonized when the temperature of the substrate is increased in the ultra high vacuum. Although the method for depositing the Si on the surface is used, other methods such as increasing vapor pressure of silicon near the surface of a specimen by silicon flux and the like can be used.

Any method can be used as long as the substrate is performed with heat treatment in vacuum and atmosphere including silicon.

Thus, as shown in FIG. 13A, the substrate having the surface composed of two surfaces is obtained. One surface is the (0001)-Si surface and the other surface is the surface tilted by 10 degrees or more from the (0001)-Si surface. Specifically, the substrate having the well-regulated surface state is obtained before the epitaxial growth.

Then, the vertical type power MOS transistor shown in FIG. 11 is formed by using the substrate shown in FIG. 13B. Or, the MOS transistor shown in FIG. 22 is formed by using the substrate shown in FIG. 13A. Preferably, the substrate 601 in FIG. 14A is made of 4H or 6H single crystal.

Thus, this embodiment has the following characteristics.

(IV) As shown in FIG. 13A, the principal surface of the silicon carbide semiconductor substrate 1 is composed of at least two surfaces, one of which is the (0001)-Si surface, and the other one of which is the surface tilted by 10 degrees or more from the (0001)-Si surface. Thus, the surface has excellent surface state and excellent regularity with suppressing a defect, compared with an eight-degree offset substrate, which is a silicon carbide semiconductor substrate having a principal surface tilted by 8 degrees from the (0001)-Si surface. Thus, the surface has excellent surface state. Specifically, the surface has a homogeneous and stable surface state in an area of a substrate surface so that the surface provides a semiconductor-device-to-be-formed surface.

Here, preferably, the angle equal to or larger than 10 degrees is in a range between 10 degrees and 20 degrees. More preferably, the angle equal to or larger than 10 degrees is in a range between 13 degrees and 20 degrees. Further, the angle equal to or larger than 10 degrees is in a range between 16 degrees and 20 degrees from the (0001)-Si surface.

Preferably, regarding to an area of the surface tilted by 10 degrees or more from the (0001)-Si surface and an area of the (0001)-Si surface, the area of the surface tilted by 10 degrees or more from the (0001)-Si surface is larger than the area of the (0001)-Si surface in the silicon carbide semiconductor substrate.

Further, the surface tilted by 10 degrees or more from the (0001)-Si surface in the silicon carbide semiconductor substrate is a (11-2N)-surface, wherein the N satisfies a relationship of $17 \leq N \leq 38$.

(V) As shown in FIG. 13B, the epitaxial layer 2 is formed on the principal surface of the silicon carbide single crystal semiconductor substrate 1 so that the epitaxial substrate is provided.

(VI) As shown in FIGS. 14A to 14F, a method for manufacturing a silicon carbide semiconductor substrate includes the steps of: a first step of preparing a silicon carbide semiconductor substrate having a principal surface composed of at least two surfaces, one of which is a surface tilted by 10 degrees or more from a (0001)-Si surface, and the other one of which is the (0001)-Si surface, wherein two surfaces are formed in such a manner that the mirror-polished silicon carbide semiconductor substrate 601 is performed with heat treatment in vacuum and atmosphere including silicon so that two surfaces are formed on the principal surface of the silicon carbide semiconductor substrate 601 by a step bunching method; and a second step of forming an epitaxial layer 2 on the principal surface in such a manner that the epitaxial layer 2 is epitaxially grown on the principal surface of the silicon carbide semiconductor substrate 1. Thus, the silicon carbide semiconductor substrate described in (V) is obtained.

Here, preferably, the angle equal to or larger than 10 degrees is in a range between 10 degrees and 20 degrees. More preferably, the angle equal to or larger than 10 degrees is in a range between 13 degrees and 20 degrees. Further, the angle equal to or larger than 10 degrees is in a range between 16 degrees and 20 degrees from the (0001)-Si surface.

In the sixth embodiment described above, although the mirror-finished silicon carbide semiconductor substrate is processed with heat treatment in the vacuum and atmosphere including silicon, instead, the mirror-finished silicon carbide semiconductor substrate can be processed with heat treatment in the vacuum, hydrogen atmosphere and hydrogen chloride atmosphere. Specifically, the substrate is processed with heat treatment at a temperature in a range between 1300° C. and 1500° C. with flowing hydrogen (i.e., $H_2$) gas and hydrogen chloride gas (i.e., HCl, including 0.1% to 10% of HCl gas). Thus, the silicon carbide semiconductor substrate having the principal surface composed of at least two surfaces is formed. Two surfaces are the (0001)-Si surface and the surface tilted by 10 degrees or more from the (0001)-Si surface, and two surfaces are provided by the step bunching on the principal surface of the silicon carbide semiconductor substrate. The other details are the same as a case where the mirror-finished silicon carbide semiconductor substrate is processed with heat treatment in the vacuum and atmosphere including silicon (i.e., it is said that the other details are the same as the above listings from (IV) to (VI)).

Such changes and modifications are to be understood as being within the scope of the present invention as defined by the appended claims.

What is claimed is:

1. A silicon carbide semiconductor substrate comprising:
   a principal surface of the substrate tilted from a (0001)-Si surface by an angle equal to or larger than 10 degrees,
   wherein the surface tilted from a (0001)-Si surface by an angle equal to or larger than 10 degrees is a (11-2N)-surface, wherein the N satisfies a relationship of $17 \leq N \leq 38$.

2. A silicon carbide semiconductor substrate, comprising:
   a principal surface of the substrate tilted from a (0001)-Si surface by an angle,
   wherein the angle is in a range between 16 degrees and 20 degrees, and
   wherein the surface tilted from a (0001)-Si surface by the angle is a (11-2N)-surface, wherein the N satisfies a relationship of $17 \leq N \leq 38$.

3. The silicon carbide semiconductor substrate according to claim 2, further comprising:
   an epitaxial layer disposed on the principal surface of the silicon carbide semiconductor substrate.

* * * * *